United States Patent
Story

(10) Patent No.: US 9,391,563 B2
(45) Date of Patent: Jul. 12, 2016

(54) CURRENT CONTROLLED TRANSCONDUCTING INVERTING AMPLIFIERS

(71) Applicant: QUALCOMM TECHNOLOGIES INTERNATIONAL, LTD., Cambridge (GB)

(72) Inventor: Michael John Story, Whittlesford (GB)

(73) Assignee: QUALCOMM TECHNOLOGIES INTERNATIONAL, LTD., Cambridge (GB)

( * ) Notice: Subject to any disclaimer, the term of this patent is extended or adjusted under 35 U.S.C. 154(b) by 197 days.

(21) Appl. No.: 14/150,014

(22) Filed: Jan. 8, 2014

(65) Prior Publication Data

US 2015/0188495 A1    Jul. 2, 2015

Related U.S. Application Data

(63) Continuation-in-part of application No. 14/143,158, filed on Dec. 30, 2013, and a continuation-in-part of application No. 14/150,164, filed on Jan. 8, 2014.

(51) Int. Cl.
*H03F 3/68* (2006.01)
*H03F 1/02* (2006.01)
(Continued)

(52) U.S. Cl.
CPC .............. *H03F 1/0211* (2013.01); *H03F 1/308* (2013.01); *H03F 1/523* (2013.01); *H03F 1/526* (2013.01); *H03F 3/16* (2013.01); *H03F 3/193* (2013.01);
(Continued)

(58) Field of Classification Search
CPC ...... H03B 5/1212; H03B 5/1228; H03F 3/72; H03F 1/523; H03F 1/526; H03M 1/66
USPC .................. 331/179, 57, 167, 117 R, 117 FE; 341/144, 155, 131; 330/295, 267
See application file for complete search history.

(56) References Cited

U.S. PATENT DOCUMENTS

| | | | |
|---|---|---|---|
| 4,099,122 A | 7/1978 | Van Buul | |
| 4,914,439 A | 4/1990 | Nakahashi et al. | |

(Continued)

FOREIGN PATENT DOCUMENTS

| | | |
|---|---|---|
| CN | 101425780 A | 5/2009 |
| CN | 101895265 A | 11/2010 |

(Continued)

OTHER PUBLICATIONS

GB Search Report issued in related GB Application No. 1413955.4, dated Jan. 26, 2015.
(Continued)

*Primary Examiner* — Arnold Kinkead
(74) *Attorney, Agent, or Firm* — Procopio, Cory, Hargreaves & Savitch

(57) ABSTRACT

An amplifier including a first transistor of a first conduction type; a second transistor of a second conduction type, the second transistor being coupled to the first transistor; an input for receiving an input signal, a control terminal of the first transistor being coupled to a control terminal of the second transistor, the control terminals being coupled to the input; an output for outputting an output signal, the output being coupled to the first transistor and the second transistor; and a current supply coupled to the first transistor and configured to supply current so as to cause a predetermined transconductance of the amplifier.

16 Claims, 3 Drawing Sheets

(51) Int. Cl.

| | | |
|---|---|---|
| *H03M 1/66* | (2006.01) | |
| *H03F 1/52* | (2006.01) | |
| *H03F 3/72* | (2006.01) | |
| *H03F 3/16* | (2006.01) | |
| *H03F 3/193* | (2006.01) | |
| *H03M 1/00* | (2006.01) | |
| *H03M 1/18* | (2006.01) | |
| *H03F 1/30* | (2006.01) | |
| *H03F 3/30* | (2006.01) | |
| *H03M 3/00* | (2006.01) | |

(52) U.S. Cl.
CPC ............ *H03F 3/3028* (2013.01); *H03F 3/3061* (2013.01); *H03F 3/72* (2013.01); *H03M 1/002* (2013.01); *H03M 1/18* (2013.01); *H03M 1/66* (2013.01); *H03F 2200/129* (2013.01); *H03F 2200/144* (2013.01); *H03F 2200/294* (2013.01); *H03F 2203/30031* (2013.01); *H03F 2203/30084* (2013.01); *H03F 2203/30117* (2013.01); *H03M 3/40* (2013.01); *H03M 3/43* (2013.01); *H03M 3/438* (2013.01)

(56) References Cited

U.S. PATENT DOCUMENTS

| | | | |
|---|---|---|---|
| 5,221,910 A * | 6/1993 | Tournier | ............... H03F 3/345 330/264 |
| 6,441,767 B1 | 8/2002 | Frazier | |
| 6,741,123 B1 | 5/2004 | Andersen et al. | |
| 7,113,119 B2 | 9/2006 | Van et al. | |
| 7,265,625 B2 | 9/2007 | Klemmer | |
| 7,336,134 B1 * | 2/2008 | Janesch | ............... H03L 7/0991 331/117 R |
| 7,450,045 B2 | 11/2008 | Liu | |
| 7,705,577 B2 | 4/2010 | Li et al. | |
| 8,354,886 B2 | 1/2013 | Brekelmans | |
| 8,519,878 B2 | 8/2013 | Jensen et al. | |
| 2003/0216863 A1 | 11/2003 | Fielder | |
| 2004/0190660 A1 | 9/2004 | Morris et al. | |
| 2005/0012481 A1 | 1/2005 | Kang et al. | |
| 2005/0111318 A1 | 5/2005 | Nakajima et al. | |
| 2005/0174184 A1 | 8/2005 | Wu | |
| 2006/0097798 A1 | 5/2006 | Cojocaru | |
| 2006/0103462 A1 | 5/2006 | Capofreddi et al. | |
| 2007/0013570 A1 | 1/2007 | Gaggl et al. | |
| 2008/0018508 A1 | 1/2008 | Filipovic et al. | |
| 2008/0018514 A1 | 1/2008 | Ryu | |
| 2008/0019066 A1 | 1/2008 | Meagher et al. | |
| 2011/0285562 A1 | 11/2011 | Tsai | |
| 2012/0025921 A1 | 2/2012 | Yang et al. | |
| 2012/0146819 A1 | 6/2012 | Silva et al. | |
| 2012/0201400 A1 | 8/2012 | Ayres | |
| 2013/0071113 A1 | 3/2013 | McKinstrie | |
| 2013/0141176 A1 | 6/2013 | Andrabi et al. | |
| 2013/0181783 A1 | 7/2013 | Upadhyaya | |
| 2013/0187803 A1 | 7/2013 | Kaald | |
| 2013/0308960 A1 | 11/2013 | Horikoshi et al. | |
| 2014/0062749 A1 | 3/2014 | Takaike et al. | |
| 2015/0188489 A1 | 7/2015 | Story | |
| 2015/0194975 A1 | 7/2015 | Miaille et al. | |

FOREIGN PATENT DOCUMENTS

| | | |
|---|---|---|
| EP | 0942531 A2 | 9/1999 |
| EP | 1801977 A1 | 6/2007 |
| JP | 2004-282479 A | 10/2004 |
| JP | 2006-314059 A | 11/2006 |
| KR | 101105380 B1 | 1/2012 |
| WO | WO 03/049280 A1 | 6/2003 |
| WO | 2006103626 A1 | 10/2006 |
| WO | 2009150611 A1 | 12/2009 |
| WO | 2012050676 A1 | 4/2012 |

OTHER PUBLICATIONS

GB Search Report issued in related GB Application No. 1413956.2, dated Aug. 14, 2015, pp. 2.
GB Search Report issued in related GB Application No. 1413956.2, dated Jan. 28, 2015.
GB Search Report issued in related GB Application No. 1413957.0, dated Dec. 29, 2014.

* cited by examiner

CURRENT CONTROLLED TRANSCONDUCTING INVERTING AMPLIFIERS

CROSS-REFERENCE TO RELATED APPLICATIONS

This application is a continuation-in-part of application Ser. No. 14/143,158, filed Dec. 30, 2013, and a continuation-in-part of application Ser. No. 14/150,164, filed Jan. 8, 2014.

This invention relates to amplifiers, in particular amplifiers for use in low power integrated circuit chip components such as low noise amplifiers (LNAs) and analogue-to-digital converters (ADCs).

BACKGROUND

A typical radio transceiver comprises an antenna, a signal processing unit for baseband processing of received signals and signals that are to be transmitted. Between the antenna and the signal processing unit are a receive chain and a transmit chain. The receive chain converts received radio frequency (RF) signals down to baseband for further processing by the signal processing unit. The transmit chain generally converts signals from baseband to RF for transmission from the antenna. The receive chain can comprise a low noise amplifier (LNA) which amplifies the received signal, one or more mixers which mixes the amplified signals with signals from local oscillators (LOs) to convert to Intermediate frequency (IF). The analogue IF signals may then converted to digital signals using analogue-to-digital converters (ADCs). The digital signals from the ADCs may then be passed further down the receive chain for further processing.

In many applications it would be desirable, in order to reduce size and cost, to implement the entire transceiver, on a single integrated circuit (IC). One difficulty in designing such an IC is that the manufacturing tolerances of devices tend to increase with decreasing feature sizes. This can lead to devices, which are intended to be identical, having different properties and characteristics. This leads to added difficulty in controlling the required performance of the components of the transceiver. Additionally, there is increasing market demand for lower power products.

There is therefore a need for greater control of transceiver component performance whilst utilising a small on-chip area and low power.

SUMMARY OF INVENTION

According to a first aspect of the disclosure, there is provided an amplifier comprising: a first transistor of a first conduction type; a second transistor of a second conduction type, the second transistor being coupled to the first transistor; an input for receiving an input signal, a control terminal of the first transistor being coupled to a control terminal of the second transistor, said gate terminals being coupled to the input; an output for outputting an output signal, the output being coupled to the first transistor and the second transistor; and a current supply coupled to the first transistor and configured to supply current so as to cause a predetermined transconductance of the amplifier.

Suitably, the amplifier further comprises a resistor coupled between the input and the output.

Suitably, the amplifier further comprises a capacitor coupled between the input and the resistor.

Suitably, the amplifier further comprises a third transistor of the first conduction type and a fourth transistor of the second conduction type, the second transistor being coupled to the first transistor via the third and fourth transistors.

Suitably, the first conduction type is P-type and the second conduction type is N-type.

Suitably, the first transistor is a PMOS having drain and source terminals and the control terminal of the first transistor being a gate terminal; the second transistor is an NMOS having drain and source terminals and the control terminal of the second transistor being a gate terminal; the current supply is coupled to the source terminal of the first transistor; and the drain terminals of the first and second transistors being coupled to each other and to the output.

Suitably, the first conduction type is N-type and the second conduction type is P-type.

Suitably, the first transistor is a NMOS having drain and source terminals and the control terminal of the first transistor being a gate terminal; the second transistor is a PMOS having drain and source terminals and the control terminal of the second transistor being a gate terminal; the current supply is coupled to the source terminal of the first transistor; and the drain terminals of the first and second transistors being coupled to each other and to the output.

Suitably, the current supply comprises a digital-to-analogue converter.

Suitably, the first and second transistors are of a 40 nm process size.

According to a second aspect of the disclosure, there is provided a low noise amplifier comprising: a first amplifier according to the amplifier described above in relation to the first aspect; and a second amplifier according to the amplifier the amplifier described above in relation to the first aspect, the input terminals of the first and second amplifiers being coupled together, the current supply of the first and second amplifiers being configured to supply the same amount of current as each other.

Suitably, the input signal is an RF signal having a frequency in accordance with the Bluetooth protocol.

According to a third aspect, there is provided an integrated circuit chip comprising the low noise amplifier as described above in relation to the second aspect, wherein the output terminal of the first amplifier is coupled to a first mixer and the output terminal of the second amplifier is coupled to a second, different, mixer.

According to a fourth aspect, there is provided an analogue-to-digital converter comprising one or more amplifiers according to the amplifier as described in relation to the first aspect.

According to a fifth aspect, there is provided an analogue-to-digital converter, comprising two conversion branches, each branch configured to receive a version of an analogue input signal and convert said signal into a digital bit stream, wherein each branch comprises a series of amplifiers according to the amplifier as described in relation to the first aspect.

Suitably, each branch comprises a series of three said amplifiers, wherein the output of a first one of said amplifiers is coupled to the input of a second one of said amplifiers and the output of said second amplifier is coupled to the input of a third one of said amplifiers.

Suitably, a first one of the conversion branches being configured to apply a positive gain to its version of the analogue input signal and a second one of the conversion branches being configured to apply a negative gain to its version of the analogue input signal.

According to a sixth aspect, there is provided an integrated circuit chip comprising: the low noise amplifier as described in relation to the second aspect; the analogue-to-digital converter as described in relation to the fourth aspect; and a current supply controller configured to control the amount of current supplied to the low noise amplifier and the analogue-to-digital converter.

According to a seventh aspect, there is provided an amplifier comprising: a first transistor of a first conduction type; a second transistor of a second conduction type; a third transistor of the first conduction type, the third transistor being coupled to the first transistor; a fourth transistor of the second conduction type, the fourth transistor being coupled to the second and third transistors; an input for receiving an input signal, a control terminal of the first transistor being coupled to a control terminal of the second transistor, said control terminals being coupled to the input; an output for outputting an output signal, the output being coupled to the third transistor and the fourth transistor; and a current supply coupled to the first transistor and configured to supply current so as to cause a predetermined transconductance of the amplifier.

BRIEF DESCRIPTION OF THE DRAWINGS

The present invention will now be described by way of example with reference to the accompanying drawings, in which.

DETAILED DESCRIPTION

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

A transconducting inverting amplifier (TIA) is an amplifier for supplying an output current in proportion to an input voltage. An input voltage can be varied over a predetermined operating range to provide an output current. Generally, within the operating range, the output current is linearly proportional to the input voltage. Thus, in some conventional applications, the TIAs have been used to control the (signal) current supplied to a circuit.

TIAs conventionally comprise at least a pair of transistors such as a PMOS and an NMOS. To provide TIAs of that have a predictable and reproducible performance, the transistor devices are generally required to be of a larger size. This is because as the devices become smaller, the influence of manufacturing variations on the performance of each device increases. Thus providing TIAs with devices of a relatively large size allows better matching between a plurality of TIAs.

However, there are many disadvantages associated with providing TIAs with large devices, such as an increase in the chip area required, greater parasitic capacitances and a consequent increase in power consumption for any particular bandwidth. For RF applications this can be a problem. Thus, traditionally, TIAs have not previously been implemented in transceivers that require small devices and low power.

Figure 1:
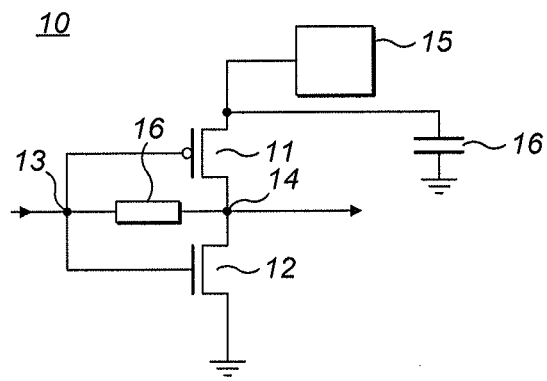
FIG. 1 illustrates an exemplary transconducting inverting amplifier (TIA)

FIG. 1 is a schematic diagram of an exemplary TIA 10. The TIA 10 comprises a first transistor 11, which may be a PMOS, and a second transistor 12, which may be an NMOS. The gate terminal of the first transistor 11 is coupled to the gate terminal of the second transistor 12. The gate terminals of the first and second transistors 11 and 12 are also coupled to an input 13 to the TIA 10. The input 13 can receive an input signal having an input voltage. The input signal may be an analogue signal which, for example, is based on an RF signal received from an antenna.

The drain terminal of the first transistor 11 is coupled to the drain terminal of the second terminal 12. The drain terminals of the first and second transistors 11 and 12 are also coupled to an output 14 to the TIA 10. The output 14 can output an output signal having a current that is dependent on the input signal and the transconductance of the TIA 10.

Conventionally, TIAs are supplied from a voltage rail of an IC. However, as mentioned above, problems can arise when devices such the first and second transistors 11 and 12 are of a small size (e.g. for devices made in a 40 nm or less process). Manufacturing tolerances and process variations tend to affect voltages, such as threshold voltages, and these in turn affect the standing currents through the devices. This in turn can cause unwanted and even unacceptable transconductance variations.

To solve this problem, the TIA 10 is current controlled. The first transistor 11 is coupled to a current supply 15 which supplies current to the TIA 10. Unless decoupled, the current supply 15 may reduce the transconductance of transistor 12, so preferably, an additional capacitor 16 may also be provided. For RF applications the capacitor 16 may be quite small (~1 pF, for example).

The current supply 15 may be adjustable so that the operating current of the TIA 10 can be controllably adjusted. Alternatively, the current supply may be fixed at a set amount of current, which may be predetermined depending on the application of the TIA 10. The transconductance of the TIA 10 is dependent on the operating current at transistors 11 and 12 and not on the voltage across the devices. As the operating current is set by the amount of current supplied by current supply 15, the transconductace of the TIA 10 can be predictably controlled by current supply 15.

The TIA 10 may be used in an IC, which requires a predetermined amount of gain to be applied to a signal. Thus the current supply 15 is configured to supply a current that causes the amplifier to have a predetermined level of transconductance to provide the required gain to a signal input at the input 13. The current supply 15 may be capable of providing a constant amount of current to the TIA 10 so as to maintain the transconductance of the TIA 10 at the predetermined level. The current supply 15 may comprise one or more digital-to-analogue converters (DACs), which can provide fine digital control of the current supplied.

The TIA 10 may comprise a resistor 16 coupled between the input 13 and the output 14, allowing the circuit to self bias.

Providing a current supply instead of a voltage supply is beneficial for controlling the TIA 10 and for negating some of the unwanted effects caused by manufacturing tolerances. The transconductance of the transistors is predominantly dependent on operating current, and to a lesser extent operating current density (which depends on geometry, which can be a very well controlled parameter). Manufacturing tolerances for other parameters (such as oxide thickness, doping profile, etc) have much less of an effect on transconductance for a given operating current, although they do affect operating voltage for that particular current. So, control of operating voltage to achieve the required currents to achieve the required transconductances requires control in fine increments (for fine control) in an overall range that has to be increased to cover more manufacturing tolerances, and so is more problematic for the circuitry. Thus current supply 15 provides simpler control of the TIA transconductance than a conventional voltage supply.

The TIA 10 shown in FIG. 1 has a current source fed PMOS and a grounded NMOS. The opposite arrangement would also be possible (i.e. a current fed NMOS and grounded PMOS) with the appropriate change in current flow direction and operating voltages. In this case, the current supply is coupled to the source terminal of the NMOS and the drain terminals of the NMOS and PMOS are coupled to each other and to the output.

Figure 1A:
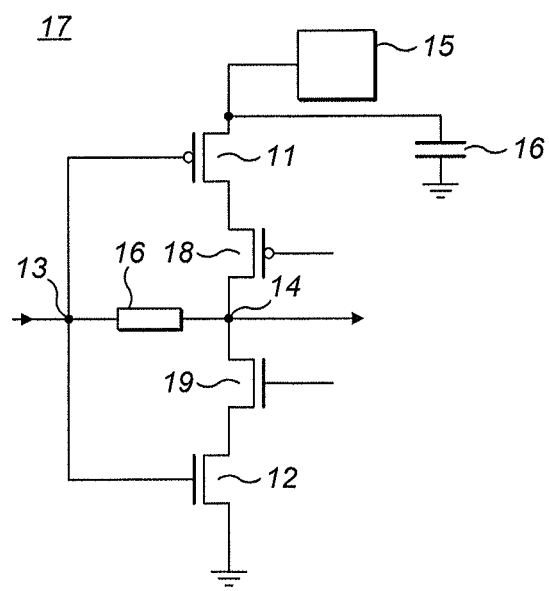
FIG. 1a illustrates an exemplary cascoded TIA.

FIG. 1a is a schematic diagram of an exemplary cascoded TIA 17. The cascoded TIA 17 comprises similar features to that of TIA 10 described above, but with additional third and fourth transistors 18 and 19. In this example, the third transistor 18 is a PMOS and the fourth transistor 19 is an NMOS. The source terminal of the third transistor 18 is coupled to the drain terminal of the first transistor 11. The drain terminals of the third and fourth transistors 18 and 19 are coupled to each other and to the output 14. The source terminal of the fourth transistor 19 is coupled to the drain of the second transistor 12. Appropriate signals can be applied to the gate terminals of the third and fourth transistors 18 for biasing. As mentioned in the paragraph above, an opposite arrangement is possible, in which case the third transistor is a NMOS and the fourth transistor is a PMOS.

Cascoded TIA 17 operates in a similar manner to TIA 10, but has the following advantages. As channel lengths get shorter (e.g. in a 40 nm process), the FET output impedance decreases. The cascoded TIA 17 provides an increase in the output impedance compared to TIA 10. Also, as channel lengths get shorter, there may be an increase in the effect the output has on the input (ideally, there should be no output-to-input interaction). The cascoded TIA 17 can act to reduce the output-to-input interaction. However, compared to TIA 10, the cascoded TIA 17 may be slower and may cause a reduction in the output voltage swing range.

Figure 2:
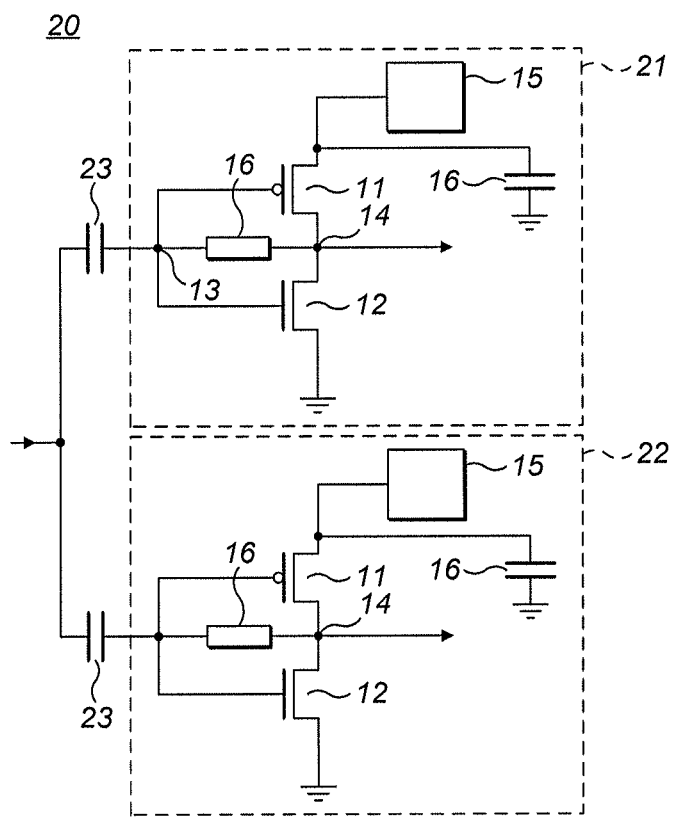
FIG. 2 illustrates an exemplary dual LNA comprising TIAs.

TIA 10 or TIA 17 can be utilised in transceiver components such as an LNA. FIG. 2 is a schematic diagram of an exemplary dual LNA 20. LNA 20 comprises a first TIA 21, which may be the same as TIA 10 or TIA 17 described in relation of FIG. 1 or FIG. 1a. LNA 20 also comprises a second TIA 22, which may also be the same as TIA 10 or TIA 17 described in relation to FIG. 1 or FIG. 1a. For the purposes of this example, FIG. 2 depicts TIA 10, although cascoded TIA 17 could alternatively be used. The input terminals 13 of the first and second TIAs 21 and 22 may be coupled together so that the LNA can provide two output signals from the same input signal. The input signal may be a received RF signal (or a version of the received RF signal such as a filtered RF signal) that requires amplification. In certain applications, two identical amplified RF signals originating from the same received RF signal may be required, for example to ultimately provide I and Q signals. The output 14 from the first TIA 21 may be coupled to a first mixer (not shown) to provide an I signal and the output 14 from the second TIA 22 may be coupled to a second mixer (not shown) to provide a Q signal.

Capacitors 23 may be provided at the input of each TIA 21 and 22. The capacitors 23 are DC blocking, but allow the RF signal through. Because the biasing arrangement (current feed) does not set voltages, and transistors 11 and 12 may have differing threshold voltages, the DC voltages at the input of each TIA may be different. Thus the capacitors 23 can provide DC blocking at the input to mitigate this difference.

Preferably, the two amplified output signals from the first and second TIAs 21 and 22 are identical or as similar as possible. As TIAs 21 and 22 are current controlled, the behaviour of the first and second TIAs 21 and 22 are better matched as their transconductances are dependent on the current supply 15, which is the same for both TIAs 21 and 22. Current supply 15 may be from a current source that is the same for both TIAs 21 and 22 or different sources that can supply the same amount of current. Furthermore, the first and second TIAs 21 and 22, which are connected together are better isolated from one another when they are current controlled than when they are voltage controlled because interaction through the supply rail is eliminated or substantially reduced. This allows the LNA 20 to advantageously provide two amplified output signals that are substantially identical.

Figure 3:
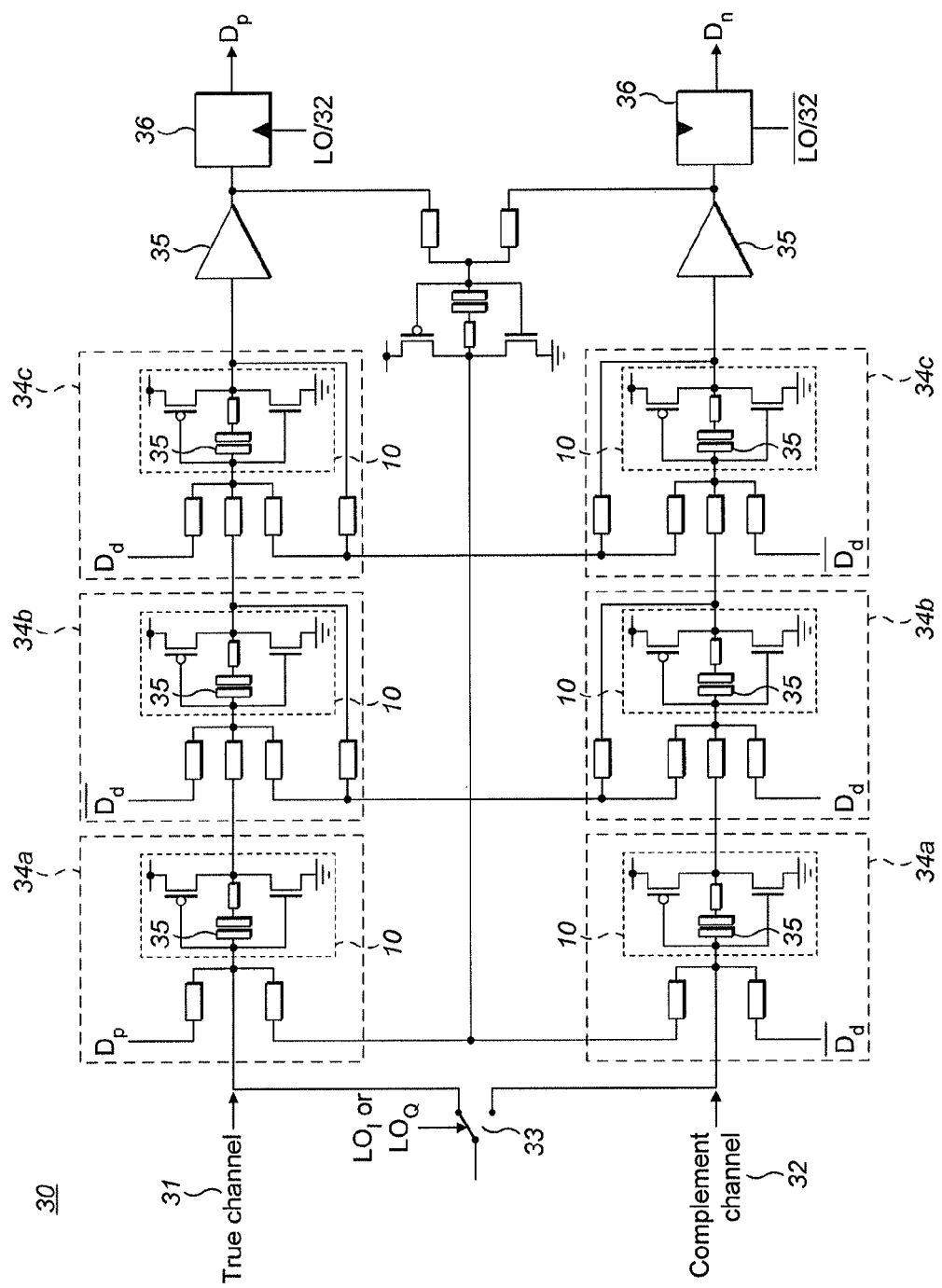
FIG. 3 illustrates an exemplary ADC comprising TIAs.

TIA 10 or cascoded TIA 17 can also be utilised in transceiver components such as an ADC. FIG. 3 is a schematic diagram of an exemplary ADC 30, which may be configured to form part of an RF receiver. For the purposes of this example, TIA 10 is depicted in FIG. 3, although cascoded TIA 17 could alternatively be used. ADC 30 comprises two conversion branches or paths: a first path 31 and second path 32. Switch 33 may be configured to mix an incoming RF signal to a lower frequency by alternately switching the input signal to the first path 31 of the ADC or the second path 32: This switching is suitably carried out at a local oscillator frequency (either in-phase or quadrature). Two ADCs, such as that illustrated in FIG. 3, may be provided in an RF receiver: one for each of the in-phase and quadrature channels.

An ADC operates at much lower signal frequencies than, for example, an LNA, so in principle the capacitor 16 might be expected to become large. However, if two ADC channels are operated in anti-phase, the currents drawn by each tend to cancel, and capacitor 16 does not have to be large. Because the ADC can operate at comparatively low frequency, it can tolerate larger transistor devices 11, 12 so that conventional matching techniques between the two channels can be used with no significant penalty, allowing the two ADC channels to be operated from common current sources.

FIG. 3 illustrates an ADC comprising three integrators 34a, 34b, 34c in each path 31 and 32. However, this is for the purposes of illustration only and any number of integrators might be used. Preferably, the two conversion paths 31 and 32 are substantially identical, but one preferably provides the inverse gain of the other. For example, one path may provide +n gain and the other may provide −n gain. Each integrator 34a-c may comprise a TIA 10 or TIA 17, as described in relation to FIG. 1 or FIG. 1a, with a capacitor 35 coupled between the input 13 and output 14. Optionally, a resistor 16 can be provided between the capacitor 35 and output 14. Each path may also comprise a single-bit quantiser 35 and a latch 36.

Input 13 at integrator 34a may receive the signal input to path 31. The output 14 at integrator 34a is coupled to the input 13 of the next integrator 34b in the path 31. The output 14 of integrator 34b is coupled to the input 13 of the next integrator 34c in the path 31. The signal output from the output 14 of the integrator 34c may then be quantised to provide an output bit stream. The input 13 at each integrator 34a-c may also receive a feedback signal $D_d$ or an inverted feedback signal. Signal path 32 mirrors signal path 31.

By providing integrators comprising current controlled TIAs, a low power ADC may be implemented.

The TIAs, LNAs and ADCs described herein are suitable for use with transceivers for radio frequency signals communicated according to any radio frequency protocol. For example, they are suitable for use with transceivers that communicate radio frequency signals according to Bluetooth protocols.

The examples herein describe arrangements in which two elements are coupled. This is intended to mean that those two elements are physically connected. However the two elements are not necessarily directly connected. For example, there may be intermediary elements in between the two elements which are coupled.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A low noise amplifier comprising:
a first amplifier comprising:
    a first transistor of a first conduction type;
    a second transistor of a second conduction type, the second transistor being coupled to the first transistor;
    an input for receiving an input signal, a control terminal of the first transistor being coupled to a control terminal of the second transistor, said control terminals being coupled to the input;
    an output for outputting an output signal, the output being coupled to the first transistor and the second transistor; and
    a current supply coupled to the first transistor and configured to supply current so as to cause a predetermined transconductance of the amplifier; and
a second amplifier comprising:
    a first transistor of a first conduction type;
    a second transistor of a second conduction type, the second transistor being coupled to the first transistor;
    an input for receiving an input signal, a control terminal of the first transistor being coupled to a control terminal of the second transistor, said control terminals being coupled to the input;
    an output for outputting an output signal, the output being coupled to the first transistor and the second transistor; and
    a current supply coupled to the first transistor and configured to supply current so as to cause a predetermined transconductance of the amplifier,
the input terminals of the first and second amplifiers being coupled together, the current supply of the first and second amplifiers being configured to supply the same amount of current as each other.

2. The low noise amplifier as claimed in claim 1, the input signal being an RF signal having a frequency in accordance with the Bluetooth protocol.

3. An integrated circuit chip comprising the low noise amplifier as claimed in claim 1, the output of the first amplifier being coupled to a first mixer and the output of the second amplifier being coupled to a second, different, mixer.

4. An analogue-to-digital converter, comprising:
two conversion branches, each branch configured to receive a version of an analogue input signal and convert said signal into a digital bit stream, wherein each branch comprises a series of amplifiers, each amplifier comprising:
    a first transistor of a first conduction type;
    a second transistor of a second conduction type, the second transistor being coupled to the first transistor;
    an input for receiving an input signal, a control terminal of the first transistor being coupled to a control terminal of the second transistor, said control terminals being coupled to the input;
    an output for outputting an output signal, the output being coupled to the first transistor and the second transistor; and
    a current supply coupled to the first transistor and configured to supply current so as to cause a predetermined transconductance of the amplifier.

5. The analogue-to-digital converter as claimed in claim 4, each branch comprising a series of three said amplifiers, wherein the output of a first one of said amplifiers is coupled to the input of a second one of said amplifiers and the output of said second amplifier is coupled to the input of a third one of said amplifiers.

6. The analogue-to-digital converter as claimed in claim 4, a first one of the conversion branches being configured to apply a positive gain to its version of the analogue input signal and a second one of the conversion branches being configured to apply a negative gain to its version of the analogue input signal.

7. An integrated circuit chip comprising:
the low noise amplifier as claimed in claim 1;
an analogue-to-digital converter comprising one or more amplifiers; and
a current supply controller configured to control the amount of current supplied to the low noise amplifier and the analogue-to-digital converter.

8. An amplifier comprising:
a first transistor of a first conduction type;
a second transistor of a second conduction type;
a third transistor of the first conduction type, the third transistor being coupled to the first transistor;
a fourth transistor of the second conduction type, the fourth transistor being coupled to the second and third transistors;
an input for receiving an input signal, a control terminal of the first transistor being coupled to a control terminal of the second transistor, said control terminals being coupled to the input;
an output for outputting an output signal, the output being coupled to the third transistor and the fourth transistor; and
a current supply coupled to the first transistor and configured to supply current so as to cause a predetermined transconductance of the amplifier.

9. The amplifier as claimed in claim 8 further comprising a resistor coupled between the input and the output.

10. The amplifier as claimed in claim 9 further comprising a capacitor coupled between the input and the resistor.

11. The amplifier as claimed in claim 8, wherein the first conduction type is P-type and the second conduction type is N-type.

12. The amplifier as claimed in claim 11, wherein:
the first transistor is a PMOS having drain and source terminals and the control terminal of the first transistor being a gate terminal;
the second transistor is an NMOS having drain and source terminals and the control terminal of the second transistor being a gate terminal;

the current supply is coupled to the source terminal of the first transistor; and the drain terminals of the first and second transistors being coupled to each other and to the output.

13. The amplifier as claimed in claim 8, wherein the first conduction type is N-type and the second conduction type is P-type.

14. The amplifier as claimed in claim 13, wherein:

the first transistor is a NMOS having drain and source terminals and the control terminal of the first transistor being a gate terminal;

the second transistor is an PMOS having drain and source terminals and the control terminal of the second transistor being a gate terminal;

the current supply is coupled to the source terminal of the first transistor; and the drain terminals of the first and second transistors being coupled to each other and to the output.

15. The amplifier as claimed in claim 8, wherein the current supply comprises a digital-to-analogue converter.

16. The amplifier as claimed in claim 8, the first and second transistors being of a 40 nm process size.

\* \* \* \* \*